United States Patent
Hövermann et al.

(10) Patent No.: US 12,500,211 B2
(45) Date of Patent: Dec. 16, 2025

(54) POWER HALF-BRIDGE MODULE, POWER INVERTER, AND METHOD FOR PRODUCING A POWER HALF-BRIDGE MODULE

(71) Applicant: Vitesco Technologies Germany GmbH, Regensburg (DE)

(72) Inventors: Markus Hövermann, Munich (DE); Michael Haber, Munich (DE); Peter Krasselt, Munich (DE); Martin Metzler, Munich (DE); Martin Ehrmann, Munich (DE)

(73) Assignee: VITESCO TECHNOLOGIES GERMANY GMBH, Regensburg (DE)

( * ) Notice: Subject to any disclaimer, the term of this patent is extended or adjusted under 35 U.S.C. 154(b) by 159 days.

(21) Appl. No.: 18/575,910

(22) PCT Filed: Jun. 27, 2022

(86) PCT No.: PCT/EP2022/067562
§ 371 (c)(1),
(2) Date: Jan. 2, 2024

(87) PCT Pub. No.: WO2023/274958
PCT Pub. Date: Jan. 5, 2023

(65) Prior Publication Data
US 2024/0339439 A1     Oct. 10, 2024

(30) Foreign Application Priority Data
Jul. 1, 2021   (DE) ............ 10 2021 206 935.5

(51) Int. Cl.
*H01L 25/07* (2006.01)
*H02M 7/00* (2006.01)
(Continued)

(52) U.S. Cl.
CPC .......... *H01L 25/072* (2013.01); *H02M 7/003* (2013.01); *H01L 24/40* (2013.01); *H01L 24/48* (2013.01);
(Continued)

(58) Field of Classification Search
CPC ...... H02M 1/327; H02M 1/348; H02M 7/003; H02M 7/5387; H01L 2224/04034;
(Continued)

(56) References Cited

U.S. PATENT DOCUMENTS 6,278,179 B1 * 8/2001 Mermet-Guyennet ............. H01L 25/071
257/723
10,079,193 B2 * 9/2018 Mohn ............ H01L 23/49838
(Continued)

FOREIGN PATENT DOCUMENTS

DE       699 37 781     12/2008   ............ H01L 25/07
DE  10 2013 219 833      4/2015   ............ H01L 23/053
(Continued)

OTHER PUBLICATIONS

Search Report for International Application No. PCT/EP2022/067562, 11 pages.
Office Action for DE Application No. 10 2021 206 935.5, 8 pages.

*Primary Examiner* — Kenneth Bukowski
(74) *Attorney, Agent, or Firm* — Slayden Grubert Beard PLLC (57) ABSTRACT

A power half-bridge module may include: a busbar carrier with insulation embedding a first busbar with two longitudinal sections; a semiconductor carrier with a second busbar and a third busbar in a row in the longitudinal direction of the busbar carrier; a first semiconductor switch with a lower-side load-current contact area on the second busbar; and a second semiconductor switch with a lower-side load-current contact area on the third busbar. The first busbar has (Continued)

a contact area on the first section and a second contact area on the second section. The busbar carrier has a recess at the height of the second section and extending from one surface to another. The semiconductor carrier is arranged on the second surface of the busbar carrier so both switches protrude into the recess. The second switch has an upper-side load-current contact area electrically connected to the second contact area of the first busbar.

30 Claims, 4 Drawing Sheets

(51) Int. Cl.
*H01L 23/00* (2006.01)
*H01L 25/18* (2023.01)

(52) U.S. Cl.
CPC .... *H01L 25/18* (2013.01); *H01L 2224/04034* (2013.01); *H01L 2224/04042* (2013.01); *H01L 2224/40227* (2013.01); *H01L 2224/48157* (2013.01); *H01L 2224/73221* (2013.01)

(58) Field of Classification Search
CPC ... H01L 2224/04042; H01L 2224/0603; H01L 2224/291; H01L 2224/29101; H01L 2224/32225; H01L 2224/40227; H01L 2224/411111; H01L 2224/48157; H01L 2224/48227; H01L 2224/49175; H01L 2224/73221; H01L 2224/73265; H01L 2224/83801; H01L 2224/8384; H01L 24/08; H01L 24/29; H01L 24/32; H01L 24/40; H01L 24/41; H01L 24/48; H01L 24/49; H01L 24/73; H01L 24/83; H01L 25/072; H01L 25/18; H01L 2924/00012; H01L 2924/00014; H01L 2924/014
See application file for complete search history.

(56) References Cited

U.S. PATENT DOCUMENTS

| | | | | |
|---|---|---|---|---|
| 10,283,447 | B1* | 5/2019 | Groening | H01L 23/055 |
| 11,272,617 | B2* | 3/2022 | Kieslinger | H05K 3/0061 |
| 2007/0177358 | A1* | 8/2007 | Schilling | H02M 7/003 |
| | | | | 361/730 |
| 2012/0326337 | A1* | 12/2012 | Camacho | H01L 24/19 |
| | | | | 257/782 |
| 2015/0092380 | A1* | 4/2015 | Hohlfeld | H05K 3/368 |
| | | | | 361/783 |
| 2019/0080992 | A1* | 3/2019 | Joos | H01L 23/49537 |
| 2020/0235558 | A1* | 7/2020 | Hass | H01L 23/62 |
| 2022/0149752 | A1* | 5/2022 | Trenz | H02M 7/003 |
| 2022/0345027 | A1* | 10/2022 | Boehmer | H02M 5/458 |

FOREIGN PATENT DOCUMENTS

| | | | | |
|---|---|---|---|---|
| DE | 10 2017 217 352 | | 3/2019 | ............ H01R 25/16 |
| DE | 102020208438 | A1 * | 1/2022 | ............ B60L 15/007 |
| DE | 102021006617 | A1 * | 1/2023 | ............ H01L 23/488 |
| DE | 102022206302 | A1 * | 7/2023 | ............ H01L 25/072 |
| DE | 102023121301 | A1 * | 2/2025 | ............ H01L 25/115 |
| WO | 2017 089029 | | 6/2017 | ............ H01L 25/07 |

* cited by examiner

POWER HALF-BRIDGE MODULE, POWER INVERTER, AND METHOD FOR PRODUCING A POWER HALF-BRIDGE MODULE

CROSS-REFERENCE TO RELATED APPLICATIONS

This application is a U.S. National Stage Application of International Application No. PCT/EP2022/067562 filed Jun. 27, 2022, which designates the United States of America, and claims priority to DE Application No. 10 2021 206 935.5 filed Jul. 1, 2021, the contents of which are hereby incorporated by reference in their entirety.

TECHNICAL FIELD

The present disclosure relates to power bridges. Various embodiments include power half-bridge modules and power inverter comprising power half-bridge modules as well as methods for producing a power half-bridge module.

BACKGROUND

Power inverters or power arrangements comprising power half-bridge modules are known and, among other things, are used in electrically driven vehicles to convert direct currents into phase currents or the other way round. As for all technical arrangements, the general requirement for the power inverters or power arrangements comprising power half-bridge modules and thus also for the power half-bridge modules is to fashion them in a more reliable manner. Moreover, the requirement for cost-effective production also applies for the power inverters or power arrangements comprising power half-bridge modules and respectively for the power half-bridge modules.

SUMMARY

The teachings of the present disclosure provide a power half-bridge module and thus a power inverter to be produced in a more reliable and more cost-effective manner. For example, some embodiments of the teachings herein include a power half-bridge module (LM), having: a busbar carrier (LP) comprising an electrically insulating insulation material in which is embedded a first busbar (SS1) which has a first longitudinal section (AB1) and a second longitudinal section (AB2) which adjoins the first longitudinal section (AB1) in the longitudinal direction of the busbar carrier (LP); wherein the first busbar (SS1) has a first exposed contact area (KF11) on the first longitudinal section (AB1) and a second exposed contact area (KF12) on the second longitudinal section (AB2) and to the side of a first surface (OF1) of the busbar carrier (LP); wherein the busbar carrier (LP) has a first recess (AS1) which is located at the height of the second longitudinal section (AB2) and extends from the first surface (OF1) to a second surface (OF2) of the busbar carrier (LP), which second surface faces away from the first surface (OF1); a semiconductor carrier (HT) which has a second busbar (SS2) and a third busbar (SS3) which are in a row in the longitudinal direction of the busbar carrier (LP); a first semiconductor switch (HS1) which by way of its lower-side load-current contact area (BK1) is arranged on a contact area (KF2) of the second busbar (SS2) and is physically and electrically connected to the second busbar (SS2); and a second semiconductor switch (HS2) which by way of its lower-side load-current contact area (BK2) is arranged on a contact area (KF3) of the third busbar (SS3) and is physically and electrically connected to the third busbar (SS3); wherein the semiconductor carrier (HT) is arranged on the second surface (OF2) of the busbar carrier (LP), wherein the first (HS1) and second (HS2) semiconductor switches protrude into the first recess (AS1); wherein the second semiconductor switch (HS2) by way of its upper-side load-current contact area (OK2) is electrically connected to the second contact area (KF12) of the first busbar (SS1).

In some embodiments, the second longitudinal section (AB2) partially or fully surrounds the first recess (AS1) in its extent.

In some embodiments, the second longitudinal section (AB2) has two limb regions (SB1, SB2) which are formed spread apart on either side of the first recess (AS1) and extend in the longitudinal direction.

In some embodiments, the two limb regions (SB1, SB2) of the second longitudinal section (AB2) are formed on either side of the first recess (AS1) symmetrically to one another about the longitudinal axis (LA1) of the first busbar (SS1).

In some embodiments, the second contact area (KF12) of the first busbar (SS1) is arranged spread apart on the two limb regions (SB1, SB2).

In some embodiments, the second contact area (KF12) of the first busbar (SS1) on the two limb regions (SB1, SB2) are embodied symmetrically in relation to one another about the first recess (AS1).

In some embodiments, the second longitudinal section (AB2) has a greater layer thickness than the first longitudinal section (AB1).

In some embodiments, the busbar carrier (LP) has a first mounting region (BB1) on the first surface (OF1), on which first mounting region a first control circuit (GT1) for actuating the first semiconductor switch (HS1) or part of the first control circuit (GT1) is formed; and the first semiconductor switch (HS1) by way of its upper-side control-signal contact area (SK1) is electrically connected to the first control circuit (GT1) or to the part of the first control circuit (GT1), respectively.

In some embodiments, the busbar carrier (LP) has a second mounting region (BB2) on the first surface (OF1), on which second mounting region a second control circuit (GT2) or part of the second control circuit (GT2) for actuating the second semiconductor switch (HS2) is formed; and the second semiconductor switch (HS2) by way of its upper-side control-signal contact area (SK2) is electrically connected to the second control circuit (GT2) or to the part of the second control circuit (GT2), respectively.

In some embodiments, the first (BB1) and/or the second (BB2) mounting region are/is electrically insulated from the first busbar (SS1) by the insulation material of the busbar carrier (LP). In some embodiments, the first (BB1) and/or the second (BB2) mounting region are/is respectively formed as a printed circuit board.

In some embodiments, the first (BB1) and/or the second (BB2) mounting region are/is cast, overmolded or encapsulated by the insulation material.

In some embodiments, the busbar carrier (LP) is formed as a printed circuit board.

In some embodiments, the busbar carrier (LP) further has a second recess (AS2) which is located at the height of the second longitudinal section (AB2) and extends from the first surface (OF1) to the second surface (OF2) of the busbar carrier (LP); and the semiconductor carrier (HT) further has an RC snubber (RC) which is arranged on the contact area (KF2) of the second busbar (SS2), is physically and electrically connected to the second busbar (SS2) and protrudes into the second recess (AS2).

In some embodiments, the second recess (AS2) is located between the first longitudinal section (AB1) and the first recess (AS1).

In some embodiments, first busbar (SS1) has a third exposed contact area (KF13) on the second longitudinal section (AB2) and to the side of the first surface (OF1) of the busbar carrier (LP); and the RC snubber (RC) is electrically connected to the third contact area (KF13).

In some embodiments, the power half-bridge module further includes: a fourth busbar (SS4) which is embedded in the insulation material of the busbar carrier (LP) and has an exposed contact area (KF4) to the side of the second surface (OF2) of the busbar carrier (LP); wherein the fourth busbar (SS4) and the first longitudinal section (AB1) overlap one another and are electrically insulated from one another by the insulation material of the busbar carrier (LP); and wherein the second busbar (SS2) by way of its contact area (KF2) is arranged on the contact area (KF4) of the fourth busbar (SS4) and is physically and electrically connected to the fourth busbar (SS4).

In some embodiments, the power half-bridge module includes: a fifth busbar (SS5) which is embedded in the insulation material of the busbar carrier (LP) and has an exposed contact area (KF5) to the side of the second surface (OF2) of the busbar carrier (LP); wherein the third busbar (SS3) by way of its contact area (KF3) is arranged on the contact area (KF5) of the fifth busbar (SS5) and is physically and electrically connected to the fifth busbar (SS5).

In some embodiments, the semiconductor carrier (HT) has an insulation layer (IS), wherein the second busbar (SS2) by way of its side facing away from the first semiconductor switch (HS1) is arranged on the insulation layer (IS) and is physically and thermally connected to the insulation layer (IS); and the third busbar (SS3) by way of its side facing away from the second semiconductor switch (HS2) is arranged on the insulation layer (IS) and is physically and thermally connected to the insulation layer (IS).

In some embodiments, the insulation layer (IS) is a ceramic insulator.

In some embodiments, the semiconductor carrier (HT) has a cooler which is arranged on one side of the insulation layer (IS) facing away from the second (SS2) and the third (SS3) busbar and is physically and thermally connected to the insulation layer (IS).

In some embodiments, the semiconductor carrier (HT) is a DCB carrier or an AMB carrier.

In some embodiments, the first semiconductor switch (HS1) by way of its upper-side load-current contact area (OK1) is electrically connected to the contact area (KF3) of the third busbar (SS3).

In some embodiments, the first busbar (SS1) is formed axially symmetrically.

In some embodiments, the fourth busbar (SS4) lies at least in part directly on the second busbar (SS2) and is physically connected to and electrically and thermally contacted with the second busbar (SS2).

In some embodiments, the fourth busbar (SS4) is soldered or sintered or adhesively bonded or welded directly on the second busbar (SS2).

In some embodiments, the fifth busbar (SS5) lies at least in part directly on the third busbar (SS3) and is physically connected to and electrically and thermally contacted with the third busbar (SS3).

In some embodiments, the fifth busbar (SS5) is soldered or sintered or adhesively bonded or welded directly on the third busbar (SS3).

In some embodiments, the power half-bridge modules form a three-phase bridge circuit of the power inverter.

As another example, some embodiments include a method for producing a power half-bridge module as described herein, comprising: providing a busbar carrier (LP) comprising an electrically insulating insulation material, wherein embedded in the insulation material is a first busbar (SS1) comprising a first longitudinal section (AB1) and a second longitudinal section (AB2) which adjoins the first longitudinal section (AB1) in the longitudinal direction of the busbar carrier (LP); forming a first exposed contact area (KF11) on the first longitudinal section (AB1) and a second exposed contact area (KF12) on the second longitudinal section (AB2), wherein the second contact area (KF12) is formed to the side of a first surface (OF1) of the busbar carrier (LP); forming a first recess (AS1) in the busbar carrier (LP), wherein the first recess (AS1) is formed at the height of the second longitudinal section (AB2) extending from the first surface (OF1) to a second surface (OF2) of the busbar carrier (LP), which second surface faces away from the first surface (OF1); providing a semiconductor carrier (HT) comprising a second busbar (SS2) and a third busbar (SS3); arranging a first semiconductor switch (HS1) by way of its lower-side load-current contact area (BK1) on a contact area (KF2) of the second busbar (SS2) and physically and electrically connecting the first semiconductor switch (HS1) to the second busbar (SS2); arranging a second semiconductor switch (HS2) by way of its lower-side load-current contact area (BK2) on a contact area (KF3) of the third busbar (SS3) and physically and electrically connecting the second semiconductor switch (HS2) to the third busbar (SS3); after arranging the first (HS1) and the second (HS2) semiconductor switch, arranging the semiconductor carrier (HT) on the second surface (OF2) of the busbar carrier (LP) in such a way that the first (HS1) and second (HS2) semiconductor switches protrude into the first recess (AS1); and electrically connecting the second semiconductor switch (HS2) by way of its upper-side load-current contact area (OK2) to the second contact area (KF12) of the first busbar (SS1).

BRIEF DESCRIPTION OF THE DRAWINGS

The figures serve to explain exemplary embodiments of the half-bridge power module LM and of a method for the production thereof. In the drawings.

DETAILED DESCRIPTION

The teachings of the present disclosure may be applied in a power half-bridge module, in particular for a power inverter, e.g., for application in an electrically driven vehicle. The power half-bridge module has a busbar carrier, the base material of which is an electrically insulating insulation material, for example in the form of an injection molding, a mold compound, or a fiber-reinforced plastic. A first busbar is embedded in the insulation material as an inlay or as a conductor track.

The first busbar is used in particular to establish an external load-current connection (or an external direct-current connection) to the power half-bridge module. The first busbar has a first longitudinal section which is used in particular to establish the aforementioned external load-current connection. The first busbar has a first exposed contact area on the first longitudinal section. The first contact area is used for the electrical contacting of the aforementioned external load-current connection. The first busbar further has a second longitudinal section which joins the first longitudinal section in the longitudinal direction of the busbar carrier and is used in particular to establish a module-internal current connection. The busbar has a second exposed contact area on the second longitudinal section and to the side of a first surface of the busbar carrier.

The term "embedded" here in particular denotes that the relevant busbars are embedded partly in the insulation material and have exposed areas or areas that are not covered by the insulation material which are not embedded in the insulation material and thus form the aforementioned exposed contact areas. In this case, the second contact area can be a large, extended, connected area. In some embodiments, the second contact area can also be a sum of a plurality of exposed contact sections which are spread apart at a distance from one another but establish the same electrical connection.

The busbar carrier has a first, continuous recess which is located at the height of the second longitudinal section of the first busbar viewed in the longitudinal direction of the busbar carrier and extends completely through the busbar carrier from the first surface of the busbar carrier to a second surface of the busbar carrier, which second surface faces away from the first surface.

The power half-bridge module further has a semiconductor carrier which has a second busbar and a third busbar which are in a row in the longitudinal direction of the busbar carrier. In this case, the second busbar is used in particular to establish the aforementioned external load-current connection. The third busbar is used in particular to establish an external phase-current connection to the power half-bridge module. The second and third busbars are for example formed as conductor tracks or as punched sheet metal parts made from a metal such as copper.

The power half-bridge module additionally has a first semiconductor switch which by way of its lower-side load-current contact area is arranged on a contact area of the second busbar and is physically and electrically connected to the second busbar.

The power half-bridge module further has a second semiconductor switch which by way of its lower-side load-current contact area is arranged on a contact area of the third busbar and is physically and electrically connected to the third busbar.

The semiconductor carrier is arranged together with the first and the second semiconductor switch on the second surface of the busbar carrier. In this case, the first and second semiconductor switches protrude into the first recess. Furthermore, the second semiconductor switch by way of its upper-side load-current contact area is electrically connected to the second contact area of the first busbar by means of a current connection, for example a bond connection.

The busbar carrier along with the embedded first busbar and the first recess forms a busbar carrier-busbar assembly which can easily be produced, stored, and transported in a cost-effective manner as a mass-produced product. One example of such an assembly is a printed circuit board comprising a copper inlay as the first busbar or an injection-molded part made of the aforementioned insulation material comprising the first busbar embedded in the molded part.

Analogously, the semiconductor carrier along with the second and third busbars together with the first and the second semiconductor switch forms a semiconductor carrier-semiconductor switch assembly which can likewise easily be produced, stored, and transported in a cost-effective manner as a mass-produced product. One example of such an assembly is an AMB (Active Metal Brazing) ceramic carrier with semiconductor switches fitted thereon. The semiconductor carrier together with the two semiconductor switches can likewise easily be assembled on the busbar carrier in a cost-effective manner.

In this case, the recess in the busbar carrier provides space for receiving the two carrier-side semiconductor switches and thus allows a comparatively compact construction of the power half-bridge module. Moreover, the recess protects the two semiconductor switches and the electrical connections thereof against external mechanical influences and thus ensures reliable operation of the two semiconductor switches and consequently of the entire power half-bridge module.

A possibility is therefore provided of fashioning a power half-bridge module and consequently a power inverter or a power arrangement comprising a mentioned power half-bridge module in a more reliable manner and of producing same in a more cost-effective manner. For example, the second longitudinal section of the first busbar partially or fully surrounds the first recess in its extent. This allows improved heat dissipation.

In some embodiments, the second longitudinal section of the first busbar has two limb regions which are formed spread apart on either side of the first recess and extend in the longitudinal direction of the busbar carrier. In particular, the two limb regions are formed symmetrically to one another about the longitudinal axis of the busbar carrier or the longitudinal axis of the first busbar along the longitudinal direction of the busbar carrier. The symmetrical embodiment of the second longitudinal section improves the current-carrying capacity of the first busbar.

In some embodiments, the second contact area of the first busbar is formed in two parts, that is to say from two area sections, which are arranged spread apart on the two limb regions. In particular, the second contact area is or the two area sections in relation to one another are embodied symmetrically about the first recess (or about the longitudinal axis of the busbar carrier or the longitudinal axis of the first busbar). The second contact area therefore allows an in particular symmetrical electrical contacting between the second semiconductor switch and the first busbar on both sides. The symmetrical embodiment of the second contact area improves the current-carrying capability from the second semiconductor switch to the first busbar.

In some embodiments, the second longitudinal section has a greater layer thickness than the first longitudinal section. As a result, the cross-sectional area of the first busbar can remain largely the same size over its entire longitudinal direction, which is also the main current flow direction in the first busbar. This is advantageous in the case where the second longitudinal section of the busbar, due to the lack of space through the recess in the busbar carrier, has to be embodied on the whole narrower than the first longitudinal section of the busbar.

In some embodiments, the busbar carrier has a first mounting region on the first surface, on which first mounting region a first control circuit for actuating the first semiconductor switch or part of this first control circuit is formed. The first semiconductor switch by way of its upper-side control-signal contact area is then electrically connected to the first control circuit or to the part of the first control circuit, respectively, by means of a signal connection, for example a further bond connection (or a plurality of further bond connections).

In some embodiments, the busbar carrier further has a second mounting region on the first surface, on which second mounting region a second control circuit for actuating the second semiconductor switch or part of the second control circuit is formed. The second semiconductor switch by way of its upper-side control-signal contact area is then electrically connected to the second control circuit or to the part of the second control circuit, respectively, by means of a further signal connection, for example a further bond connection (or a plurality of further bond connections).

Here, a control circuit for actuating a semiconductor switch or part thereof may comprise an entire driver stage for actuating or driving the semiconductor switch or only part of the driver stage, such as, e.g., a signal connection or control-signal connection (leads, signal conductor tracks) between the semiconductor switch and the rest of the driver stage, for example in the form of a conductor track or a conductor track section and/or in the form of a signal attachment, such as, e.g., a press fit, or a gate resistor of the driver stage and a current connection between the gate resistor and the semiconductor switch. Equally, a control circuit or part thereof may only comprise a measurement-signal connection, for example in the form of a conductor track or a conductor track section and/or in the form of a measurement-signal attachment, such as, e.g., a press fit, for forwarding a measurement signal from the semiconductor switch to a measuring circuit which for example forms part of the control circuit.

If the semiconductor switches are each formed as a MOSFET (Metal-Oxide-Semiconductor Field-Effect Transistor), the corresponding control circuits are thus each formed as a gate driver. The upper-side control-signal contact area of the respective semiconductor switches then forms the gate connector of the respective semiconductor switches. The lower-side load-current contact area of the respective semiconductor switches then forms the drain connector of the respective semiconductor switches. The upper-side load-current contact area of the respective semiconductor switches then forms the source connector of the respective semiconductor switches.

The two mounting regions on the first surface of the busbar carrier allow short control-signal paths from the respective control circuits to the respective corresponding semiconductor switches. As a result, the entire layout of the power half-bridge module can be simplified. Additionally, the entire circuit is more resistant to interference on the whole.

The first and/or the second mounting region, and respectively the first and/or the second control circuit, are electrically insulated from the first busbar for example by insulation material of the busbar carrier. In the respective mounting region, conductor tracks for forming circuit functions of the corresponding control circuit are provided, however, which conductor tracks are however electrically insulated from one another and from the first busbar by the insulation material of the busbar carrier in accordance with the circuit layout of the respective control circuit. As a result, the two control circuits can easily be formed on the busbar carrier. Additional printed circuit boards for the control circuits are accordingly dispensed with.

In some embodiments, the first and/or the second mounting region are/is respectively formed as a printed circuit board.

In some embodiments, the first and/or the second mounting region, in particular if they are formed as printed circuit boards, are/is cast, overmolded or encapsulated by the insulation material and thus embedded in the insulation material (for example up to the respective mounting surfaces).

In some embodiments, the busbar carrier itself is formed as a printed circuit board. In this case, the first and/or the second mounting region are/is formed as partial sections of the busbar carrier.

In some embodiments, the first and second mounting regions are arranged spread apart on two opposite sides of the first recess. The first mounting region, the recess and the second mounting region lie in a row viewed in the longitudinal direction of the busbar carrier. As a result, the utilization of space on the busbar carrier is optimized.

In some embodiments, the busbar carrier further has a second, continuous recess which is located at the height of the second longitudinal section of the first busbar viewed in the longitudinal direction of the busbar carrier and extends completely through the busbar carrier from the first surface of the busbar carrier to the second surface of the busbar carrier. The semiconductor carrier further has, for example, an RC snubber (RC element), for example a silicone snubber, which is arranged on the contact area of the second busbar next to the first semiconductor switch. The RC snubber is physically and (in accordance with the circuit layout of the power half-bridge module) electrically connected to the second busbar. After arranging the semiconductor carrier on the second surface of the busbar carrier, the RC snubber protrudes into the second recess. Viewed in the longitudinal direction of the busbar carrier, the second recess is located, for example, between the first longitudinal section and the first recess.

In some embodiments, the first busbar has a third exposed contact area on the second longitudinal section and to the side of the first surface of the busbar carrier. The RC snubber is then electrically connected to the third contact area of the first busbar by means of a further current connection, for example a further bond connection.

The third contact area can be a large, extended, connected area. In some embodiments, the third contact area can also (like the second contact area) be a sum of a plurality of exposed contact sections which are spread apart at a distance from one another but establish the same electrical connection. The second recess, like the first recess, allows the entire power half-bridge module to be constructed in a way that is optimized in terms of assembly space.

In some embodiments, the power half-bridge module further has a fourth busbar, in particular for establishing the aforementioned external load-current or direct-current connection. The fourth busbar is embedded in the insulation material of the busbar carrier as a further inlay or as a further conductor track and has an exposed contact area on the second surface of the busbar carrier. In this case, the fourth busbar and the first longitudinal section of the first busbar largely, or even completely, overlap one another. Furthermore, the fourth busbar and the first longitudinal section of the first busbar are electrically insulated from one another by the insulation material. The second busbar by way of its contact area is arranged on the contact area of the fourth busbar and is physically and electrically connected to the fourth busbar, for example by soldering, sintering, welding, or by means of a suitable materially bonded connection. The overlapping of the fourth busbar and of the first longitudinal section of the first busbar, through which a load current or direct current flows in the opposite flow direction, reduces parasitic inductance.

In some embodiments, the power half-bridge module further has a fifth busbar, in particular for establishing the aforementioned phase-current connection. The fifth busbar is embedded in the insulation material of the busbar carrier as a further inlay or as a further conductor track and has an exposed contact area on the second surface of the busbar carrier. The third busbar by way of its contact area is arranged on the contact area of the fifth busbar and is physically and electrically connected to the fifth busbar, for example by soldering, sintering, welding, or by means of a suitable materially bonded connection.

In some embodiments, the semiconductor carrier has an insulation layer. The second busbar by way of its side facing away from the first semiconductor switch is arranged on the insulation layer and is physically and thermally connected to the insulation layer, for example by adhesive bonding, sintering, or by means of a suitable materially bonded connection. Analogously, the third busbar by way of its side facing away from the second semiconductor switch is arranged on the insulation layer and is physically and thermally connected to the insulation layer, for example by soldering, sintering, welding, or by means of a suitable materially bonded connection.

In some embodiments, the insulation layer is formed as a ceramic insulator.

In some embodiments, the semiconductor carrier further has a cooler arranged on one side of the insulation layer facing away from the second and the third busbar and is physically and thermally connected to the insulation layer.

In some embodiments, the semiconductor carrier is formed as a DCB (Direct Copper Bonding) carrier or an AMB carrier (or a DCB substrate or an AMB substrate).

In some embodiments, the first semiconductor switch by way of its upper-side load-current contact area is electrically connected to the contact area of the third busbar by means of a further current connection, for example a further bond connection.

In some embodiments, the semiconductor switches are formed as transistors based on silicon carbide or gallium nitride, such as, e.g., SiC-MOSFETs (Silicon-Carbide Metal-Oxide-Semiconductor Field-Effect Transistors) or GaN-MOSFETs (Gallium-Nitride Metal-Oxide-Semiconductor Field-Effect Transistors). In some embodiments, the semiconductor switches can be formed as field-effect transistors based on beta-Ga2O3 (beta-gallium oxide). It is also possible for the semiconductor switches to be formed as Si-IGBTs, that is to as IGBTs based on silicon (Silicon-Carbide Insulated-Gate Bipolar Transistors).

In some embodiments, the first busbar is formed axially symmetrically in the longitudinal direction of the busbar carrier.

In some embodiments, the fourth busbar lies at least in part directly on the second busbar and is directly physically connected to and electrically and thermally contacted with the second busbar. In some embodiments, the fourth busbar is soldered or sintered or adhesively bonded or welded directly on the second busbar. Analogously, the fifth busbar lies for example at least in part directly on the third busbar and is directly physically connected to and electrically and thermally contacted with the third busbar. For example, the fifth busbar is soldered or sintered or adhesively bonded or welded directly on the third busbar.

The lower-side busbars of the (upper) busbar carrier, namely the fourth and the fifth busbar, form the lower side of this (upper) carrier. Analogously, the second and third busbars of the semiconductor carrier form the upper side of the (lower) semiconductor carrier. The (upper) busbar carrier by way of its lower side, that is to say the fourth and the fifth busbar, lies directly on the upper side of the (lower) semiconductor carrier, that is to say the second and the third busbar, and is physically, and also electrically and thermally, fixedly connected to the semiconductor carrier.

As a result, no additional connecting means are required, which are only provided to establish a physical or mechanical connection between the two carriers. Moreover, the direct connection between the lower side of the (upper) busbar carrier and the upper side of the (lower) semiconductor carrier forms a seal for cavities around the semiconductor switches which in the event of subsequent encapsulation of the semiconductor switches with a molding compound is used as a barrier which prevents the molding compound from flowing off downward. As a result, no additional sealing between the two carriers is required.

Some embodiments include a power inverter, in particular for an electrically driven vehicle. The power inverter has at least three above-described power half-bridge modules. In this case, the power half-bridge modules form a three-phase bridge circuit of the power inverter.

Some embodiments include a method for producing an above-described power half-bridge module. A busbar carrier comprising an electrically insulating insulation material is provided, wherein embedded in the insulation material as an inlay or a conductor track is a first busbar comprising a first longitudinal section and a second longitudinal section which adjoins the first longitudinal section in the longitudinal direction of the busbar carrier.

A first exposed contact area is formed on the first longitudinal section of the first busbar. Analogously, a second exposed contact area is formed on the second longitudinal section of the first busbar, wherein the second contact area is formed on a surface of the second longitudinal section, which surface lies to the side of a first surface of the busbar carrier. In this case, the contact areas can for example be formed by removing insulation material, such as, e.g., by milling the busbar carrier, at the corresponding positions of the busbar carrier.

A first, continuous recess is formed in the busbar carrier, wherein this recess is formed at the height of the second longitudinal section of the first busbar viewed in the longitudinal direction of the busbar carrier and extending completely through the busbar carrier from the first surface of the busbar carrier to a second surface of the busbar carrier, which second surface faces away from the first surface. The recess can for example be formed by removing insulation material, such as, e.g., by milling the busbar carrier. In some embodiments, the recess can already be formed while forming the busbar carrier.

In addition, a semiconductor carrier comprising a second busbar and a third busbar is provided.

Arranged on an exposed contact area of the second busbar is a first semiconductor switch which by way of its lower-side load-current contact area is physically and electrically connected to the second busbar, for example soldered, sintered, welded, or materially connected in a similar way to the second busbar.

Analogously, arranged on an exposed contact area of the third busbar is a second semiconductor switch which by way of its lower-side load-current contact area is physically and electrically connected to the third busbar, for example soldered, sintered, welded or materially connected in a similar way to the third busbar.

Once the two semiconductor switches have been arranged on the respective busbars and electrically connected to the respective busbars, the semiconductor carrier together with the two semiconductor switches is arranged on the second surface of the busbar carrier and attached to the busbar carrier. In this case, the semiconductor carrier is placed on the second surface of the busbar carrier in such a way that the two semiconductor switches protrude into the first recess in the busbar carrier.

Subsequently, the second semiconductor switch by way of its upper-side load-current contact area is electrically connected to the second contact area of the first busbar by means of a current connection, for example a bond connection.

Figure 1A:
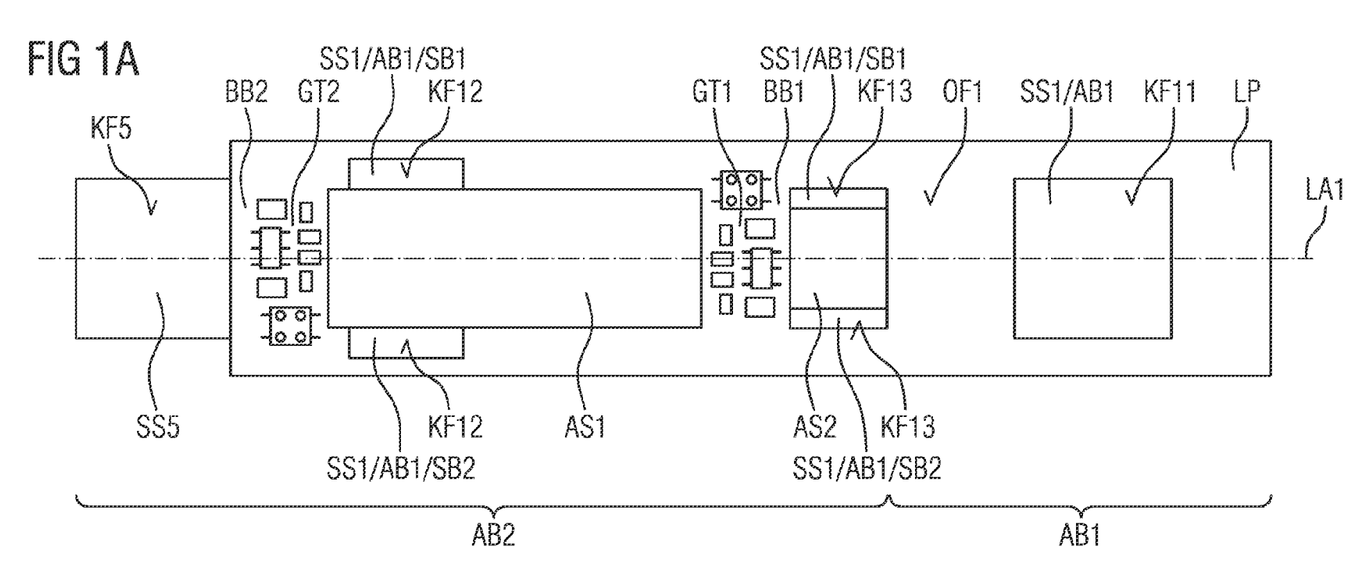
FIGS. 1a and 1b show a printed circuit board of an example half-bridge module incorporating teachings of the present disclosure.
Figure 1B:
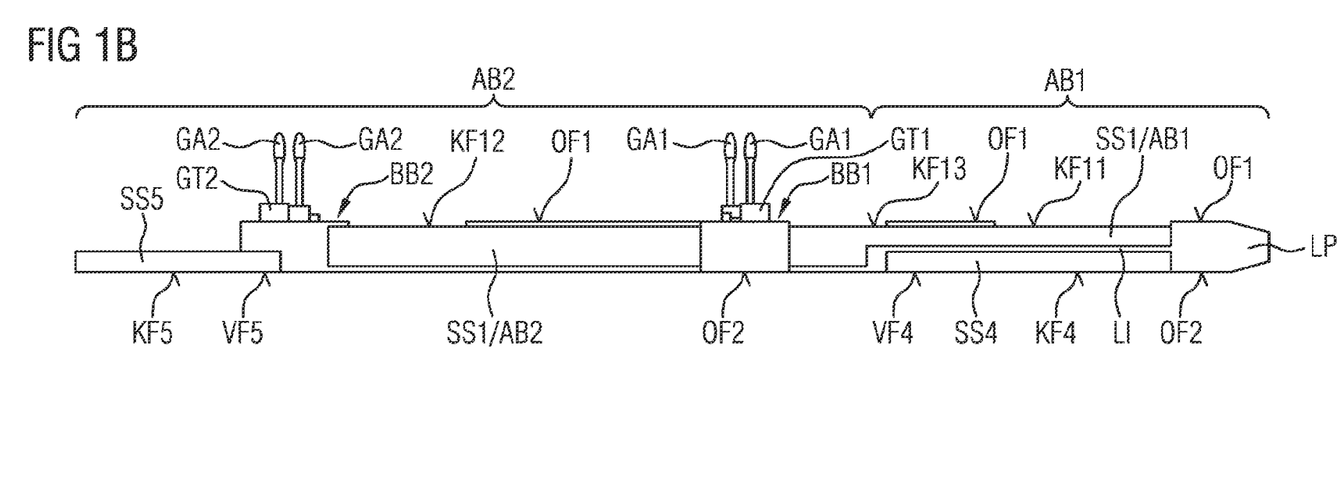

The printed circuit board LP of FIG. 1a is illustrated in a plan view so that the first surface OF1 of the printed circuit board LP can be seen. This first surface OF1 can be regarded as the upper side, while the lower side, namely the second surface OF2 of the printed circuit board, is illustrated in FIG. 1b. The printed circuit board LP of FIG. 1a has an elongated, rectangular basic shape (side ratio>1:3 or >1:5), wherein the extent along a longitudinal direction LA1 is referred to as the length and constitutes the longer of the sides of the rectangular basic shape. The printed circuit board LP illustrated in FIG. 1a can be divided into a first longitudinal section AB1 and a second longitudinal section AB2. These sections relate to the longitudinal direction LA1, i.e. the direction of the length of the rectangular basic shape.

The term printed circuit board is understood to mean boards or carriers as a conductor/insulator layer assembly. These can be produced by creating a layer structure (conductor layer or conductor layers, for instance copper layers, and one or more insulating intermediate layers or overlays, for instance glass fiber fabrics) and by subsequent pressing/bonding. In particular, a liquid insulator substance, for instance a resin or prepreg, can be introduced before the pressing. A printed circuit board can also be produced as an overmolded busbar carrier in which the conductor layer or conductor layers is/are overmolded with an (insulating) plastic. This plastic can also be introduced in intermediate spaces between conductor layers. The conductor layers form the busbars described here. The conductor layers can be provided as thick copper parts, for instance with thicknesses of more than 100 or 500 μm, for instance 1 mm or 2 mm. Different conductor layers or busbars can have the same or different thicknesses.

In particular, the first busbar can have different thicknesses at different sections; for instance at a section at which a recess is provided, the first busbar can have a greater thickness than at another section, for instance at a section at which another busbar lies underneath the first busbar (in an electrically insulated manner). At the section with lesser thickness, space is therefore created for the other busbar. The sum of the lesser thickness and the thickness of the other busbar (possibly including an insulation layer laid in between) can substantially correspond to the greater thickness. Embodiments of the printed circuit board provide for this to be in the form of a HDI, thick copper, FR2, FR3, FR4 or FR5 printed circuit board. Insulation layers of the printed circuit board are preferably constructed on the basis of plastic, resin or prepreg, in particular as a fiber-reinforced plastic with glass fiber matting.

Provided in the first longitudinal section AB1 of the printed circuit board LP, in particular as an inlay, is a first busbar SS1 which is produced for example from a copper sheet, steel sheet, or aluminum sheet. A first exposed contact area KF11 can be seen in FIG. 1a. Furthermore, free contact areas of the first busbar SS1 having the reference signs KF12 and KF13 can be seen, which free contact areas are located in the second section AB2. The contact areas KF12, KF13 are also exposed but do not extend over the entire width (which extends in the vertical direction in FIG. 1a); rather, they have the shape of strips (at the edge of a recess AS1 or AS2). In the embodiment illustrated in FIG. 1a, the contact area KF11 in the first section is likewise an exposed area which is bordered by an insulation layer provided on the first busbar SS1. However, it is also conceivable for the contact area KF11 to be exposed over the full width (vertical direction in FIG. 1a) in the first longitudinal section or a section thereof. In addition, the contact area KF11 can also be exposed up to that end of the first longitudinal section AB1 that is opposite the second longitudinal section AB2.

The first busbar SS1 may be separated throughout only by a conceptual division into two sections AB2, AB1. However, there may be two longitudinal sections AB1, AB2 with their own first busbar, which busbars are physically separate but electrically connected to one another. This electrical connection is in particular provided where the first longitudinal section AB1 passes over into the second longitudinal section AB2, i.e. at the end areas of the busbars SS1 of the respective sections AB1, AB2.

Located at the second longitudinal section AB2 is a recess AS1 and an optional recess AS2. The recess in the printed circuit board LP also extends through the first busbar SS1. This also applies to the optional recess AS2. The recess is thus a through hole in relation to the printed circuit board LP (and in relation to the first busbar). An edge-closed recess AS1 is illustrated, wherein the optional recess AS2 is also closed at the edges. However, it is conceivable for the recess AS1 or recess AS2 to be shifted laterally toward the edge, perpendicular to the longitudinal direction LA1 (i.e. toward the upper or lower edge), as a result of which the printed circuit board LP or the first busbar SS1 does not completely surround the recess AS1 or the recess AS2 at the edges but rather only partially surrounds the latter.

Seen from the first longitudinal section AB1, the first busbar SS1 can end before that end of the printed circuit board LP that is opposite the first longitudinal section AB1. In other words, seen from the first longitudinal section AB1, the first busbar SS1 can have an open end and for example end at that end of the recess AS1 that is opposite the first longitudinal section AB1. This is illustrated in FIG. 1A and in particular in FIG. 2A. This results in the first busbar SS1 having an open end which points away from the first longitudinal section AB1 and in particular points toward the opposite second end at which a free contact area KF5 of a further busbar SS5 is located. The free contact area KF5 is opposite the contact area KF11 of the first busbar SS1.

As mentioned, in addition to the first busbar SS1, the printed circuit board LP can also have a second busbar SS5 with an exposed contact area KF5. This contact area KF5 can be used as a phase connection, while the contact area KF11 (or else the contact area KF4 of a busbar SS4) can for example be used for connecting a direct-voltage supply potential.

The recesses AS1 and AS2 allow components (in particular semiconductor switches and possibly also a snubber component) to extend into them or of at least providing free access to the relevant component through the recess for the electrical connection. It is then possible to contact these components by means of the contact areas KF12 and/or KF13 from the printed circuit board LP, since the relevant recess provides access to the protruding components. The contact areas KF12, KF13 are provided for the power connection (load-current connection) to the components to which the recess affords access. The components are fitted on a semiconductor carrier HT, cf. FIGS. 3A-4B.

In some embodiments, there are control-signal contact areas which guide a signal current and are used to electrically connect actuation-signal connections to the components. The contact areas KF12, 13 and also control-signal contact areas are provided on the surface OF1, i.e. on the illustrated upper side of the printed circuit board LP. The connection made possible by the recess is also explained in more detail with reference to FIGS. 4A, 4B. Moreover, busbars of the module also have connection surfaces (VF5, VF4) provided on the opposite surface OF2. By placing the printed circuit board on a semiconductor carrier, the connection areas of the printed circuit board can be used to provide a direct connection to the semiconductor carrier, for instance a soldered connection or a sintered connection.

The first busbar SS1 has two limb regions SB1, SB2 on the second longitudinal section AB2, which limb regions are formed in the manner of legs spaced apart on either side of the first recess AS1 and extend in the direction of extent of the longitudinal axis LA1 of the first busbar SS1 and respectively around the recess (or the first recess) AS1. In particular, the two limb regions SB1, SB2 are formed symmetrically in relation to one another about the longitudinal axis LA1.

The contact areas KF12 of the first busbar SS1, which in this embodiment consist of two area sections, are formed spaced apart on the two limb regions SB1, SB2 of the first busbar SS1 and are embodied symmetrically in relation to one another about the longitudinal axis LA1 of the first busbar SS1 and respectively around the recess AS1.

The printed circuit board illustrated in FIG. 1a is used to connect components (of a semiconductor carrier), which are provided inside the recesses AS1 and AS2, to the busbars of the printed circuit board LP for the purpose of electrical connection and to provide electrical contact via the exposed contact areas KF11, KF5 in order to allow connection to external potentials such as phase potential or direct-voltage potentials (of a supply direct voltage). In particular, the printed circuit board LP is used to connect components located in the recesses of the power half-bridge module to the connection options KF11, KF5.

In some embodiments, the printed circuit board LP includes a first mounting region BB1 and possibly a second mounting region BB2. Control circuits or monitoring circuits can be provided there, for example gate drivers GT1, GT2. In some embodiments, provision can be made in the respective mounting regions BB1, BB2 for only part of the respective gate driver in each case, or even for only one gate resistor and its respective supply lines or outgoing lines in each case, or for only supply lines or outgoing lines of respective control or monitoring circuits to the respective corresponding semiconductor switches HS1, HS2 in each case.

Since the mounting region is located at the edge of the recesses AS1, AS2, a direct connection of the relevant circuits GT1, GT2 to the components is possible in a direct way. The contact areas KF12, KF13 are also located at the edge of the recess and thus allow direct contact. FIG. 1a shows that the contact areas KF12, KF13 adjoin the recess AS1, AS2 directly. This also applies to the mounting region BB1 and the mounting region BB2.

However, for instance for better insulation, provision can also be made for the contact areas KF12, KF13 or else contact areas of the mounting region BB2, BB1 or else contact areas of the control circuit present there to adjoin the relevant recess AS1 (or else AS2) non-directly, said contact areas instead adjoining the relevant recess indirectly via an insulation region, for instance in the form of a bar. In this case, the printed circuit board also has conductor track structures for control and/or monitoring circuits. These structures are part of the printed circuit board. For instance, in the case of a printed circuit board which is in the form of a (plastic) overmolded busbar carrier, a control printed circuit board can provide the mounting region.

Provision can be made for a plurality of control printed circuit boards which each provide a mounting region. The relevant circuit can be provided on or in the mounting region. The control printed circuit board can be provided as a printed circuit board in particular with thinner conductor layers than the busbars. The control printed circuit board can be in the form of an FRn printed circuit board (n=1 . . . 0.5) or a HDI printed circuit board. The control printed circuit board(s) is (are) overmolded during the production of the printed circuit board which has the busbars. The one or more control printed circuit boards are inlays (as well as the busbars) of the printed circuit board which is in the form of an overmolded busbar carrier.

In the region of the contact area KF11, the first busbar SS1 can have a lesser width than the printed circuit board LP in order to thus provide lateral insulation possibilities through the printed circuit board. This applies in particular to the contact areas KF4 and/or KF5 too. In the same way, provision can be made for the second busbar SS4 of the printed circuit board LP to be narrower than the printed circuit board LP in order to likewise allow a spacing to adjoining modules for insulation purposes. Before or at the start of the second section AB2, the first busbar SS1 widens in the running direction of the longitudinal direction LA1 from the first section AB1 to the second section AB2, wherein this can be realized in a staggered manner or else by means of a constant widening. The greater width, which thus results for the second section AB2, allows the busbar to have a high current-carrying capacity despite the recess (which is narrower than the width of the busbar SS1 in the second section).

In some embodiments, the thickness of the busbar SS1 in the second section AB2 and in particular at the height of the first recess AS1 is greater than in the first longitudinal section AB1. As a result, e.g. coming from section AB1 toward section AB2, a substantially identical (or only negligibly, i.e. <10%, <20% or <30% lesser) conductor cross section of the first busbar SS1 is achieved in the second section AB2 compared to the first section AB1.

FIG. 1B shows a cross section through the printed circuit board LP from FIG. 1A. In the first longitudinal section AB1, the first busbar SS1 can be seen, which first busbar passes over into the section AB2. On account of the central recess in the first busbar SS1, which is clearly evident in FIG. 2A, provision can be made for a first mounting region BB1 which has a monitoring and/or control circuit GT1 or gate driver circuit mounted thereon. Projecting from this circuit are pins GA1 (for instance control connections) which extend away from the first surface OF1 of the printed circuit board LP. These pins GA1 (and also the pins GA2) serve to connect a superordinate controller to the circuit GT1 or GT2 in a signal-transmitting or actuating manner. In the same way, at that end of the second section AB2 that is opposite the first section AB1, a control circuit GT1 is likewise provided in a second mounting region BB2. Also there are pins GA2 in the form of control connections (generally: signal connections) extending away from the printed circuit board.

As illustrated in FIG. 1A, located in the second section are two recesses AS1, AS2 which are hidden by the first busbar SS1 in the side view of FIG. 1B (lateral plan view). In order to be able to contact the components that are able to be introduced there, the busbar has the contact areas KF12 (for the components in the first recess AS1) and contact areas KF13 (for contacting the components in the second recess AS2).

A second busbar SS4 of the printed circuit board LP is provided in the first longitudinal section AB1 underneath a longitudinal section of the first busbar SS1. As illustrated, the busbar SS4 is electrically insulated from the busbar SS1 by an insulation layer LI of the printed circuit board LP. A third busbar SS5 of the printed circuit board LP extends away from that end of the printed circuit board LP that is opposite the first section AB1. This therefore results in the busbar SS5 with a contact area KF5 at one end of the printed circuit board LP, and a contact area KF11 of the first busbar SS1 and a contact area KF4 of the busbar SS4 at the opposite end, wherein these contact areas KF11 and KF4 are provided at that end of the printed circuit board that is opposite the second section.

These contact areas KF11, KF4 and KF5 are used for electromechanical connection to the outside, that is to say for connecting to components of an electrical system external to the module LM. The contact areas KF11, KF4 and KF5 in particular form plug contacts but can also be provided for connection by means of soldering, sintering or welding.

The busbar SS4 further has a connection area VF4 for electrically connecting (for instance soldering, sintering or welding) to a semiconductor carrier HT which is described further below. The contact area KF4 (for external connection) of the busbar SS4 is provided at a section of the busbar SS4 which is further away from the second section than the connection area VF4. The contact area therefore lies further out on the printed circuit board for easy connection to external components or to an external electrical system. The areas VF4 and KF4 are formed from the same surface of the busbar SS4 on the lower side OF2 or second surface OF2 (lower side) of the printed circuit board LP. The connection area VF4 of the busbar SS4 is provided on the opposite side to that surface OF1 (upper side) of the printed circuit board LP on which the control connections GA2, 1 and the mounting regions BB1, BB2 or else the control circuits GT1, 2 are located. There is an optional insulated termination at those ends of the busbars SS4, SS1 that are opposite the second section AB2 of the printed circuit board LP. This termination can attach to the printed circuit boards in the longitudinal direction or can be formed of consistent-width insulation layers on the busbars SS4, SS1.

The busbar SS5, like the busbar SS4, has a contact area KF5 and a connection area VF5 for the connection of a semiconductor carrier HT described further below. The contact area KF5 lies, in relation to the printed circuit board LP, further out than the connection area VF5. The connection areas VF4, VF5 of the busbars SS4, SS5 are provided on the same side, namely on the lower side or on the surface OF2 of the printed circuit board LP. The connection areas VF4, VF5 lie closer together than the contact areas KF4, KF5 with the result that the contact areas KF4, KF5 provided for the external connection lie further out than the connection areas VF4, VF5. As a result, in relation to the longitudinal direction LA1, at the height of the contact areas VF4, VF5 a semiconductor carrier can be attached from below (and electrically connected thereto), while even when the semiconductor carrier HT is attached the contact areas KF4, KF5 are exposed for the connection of external components.

The three busbars SS1, SS4 and SS5 of FIG. 1b are in particular inlaid metal sheets, for example copper tracks, which are pressed together with insulation material of the printed circuit board in order to thus at least in part form the printed circuit board LP. These busbars can also be mechanically connected to each other by overmolding (with a plastic). After the pressing or overmolding, the circuits GT1 or GT2 can be fitted by surface mounting. Differing from this, in particular in the case of overmolded busbars, at least one control printed circuit board can be overmolded. This control printed circuit board can then be mounted. The mounting results in control and/or monitoring circuits as circuits GT1, GT2.

In some embodiments, before circuits are assembled on the surface OF1 (in regions BB1, BB2), the one or more recesses AS1, AS2 from FIG. 1a are created, for instance by punching or by milling the printed circuit board. The recess in the first busbar SS1 can be produced by this milling; In some embodiments, the busbar SS1 is provided with the recess before the printed circuit board is produced by pressing or as an overmolded busbar carrier. The recess in the busbar SS1, which is part of the recess AS1 (or else AS2) of the printed circuit board, can be produced by punching or milling of the busbar, in particular before being combined with the other busbars SS5, SS4 of the printed circuit board LP.

The busbar SS5 can, in the section in which it protrudes from the rest of the printed circuit board LP, be exposed on one side or preferably on both sides, provided that the production process ensures that the insulation material has been applied. The contact area KF11 can be exposed too, after the pressing of the printed circuit board LP. In some embodiments, the contact area KF11 can be formed by virtue of no insulation material being applied in this region during the production of the printed circuit board LP. This then applies to the contact areas KF12 and/or 13 too. The latter can likewise be milled or be processed during the production in such a way that no insulation material (resin, prepreg, plastic overmolding) is applied thereto. The exposing may be carried out after the busbars SS1, SS4, SS5 of the printed circuit board LP have been combined by producing the printed circuit board LP (for example after the pressing or overmolding).

Figure 2A:
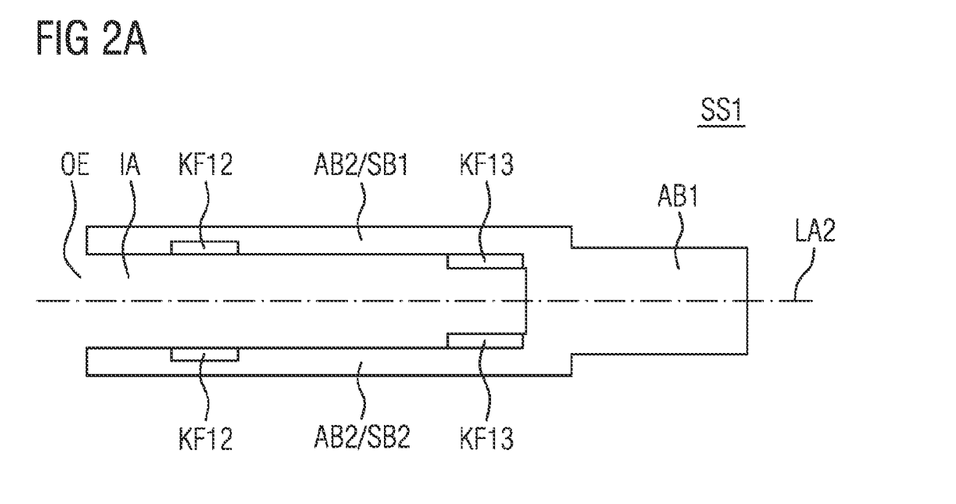
FIGS. 2a and 2b depict an example busbar incorporating teachings of the present disclosure.

FIG. 2a shows a plan view of an exemplary first busbar SS1 having a first section AB1 and a second section AB2. These sections substantially correspond to the sections AB1, AB2 of the printed circuit board LP in the longitudinal direction, which is why the same reference signs have been used. In the first section AB1, the busbar SS1 is tapered in width compared to the second section AB2. As can be seen from FIG. 2b, the thickness of the busbar SS1 is also less there than in the second section AB2. The lesser thickness serves the purpose of allowing the busbar SS4 to be inserted underneath the first section AB1 of the first busbar SS1. The difference in thickness between section AB1 and section AB2 of the busbar SS1 may be greater than the thickness of the busbar SS4 with the result that the latter can be inserted, including the intermediate insulation layer, without the busbar SS4 protruding with respect to the rest of the surface OF2 (cf. FIG. 1b).

Figure 2B:
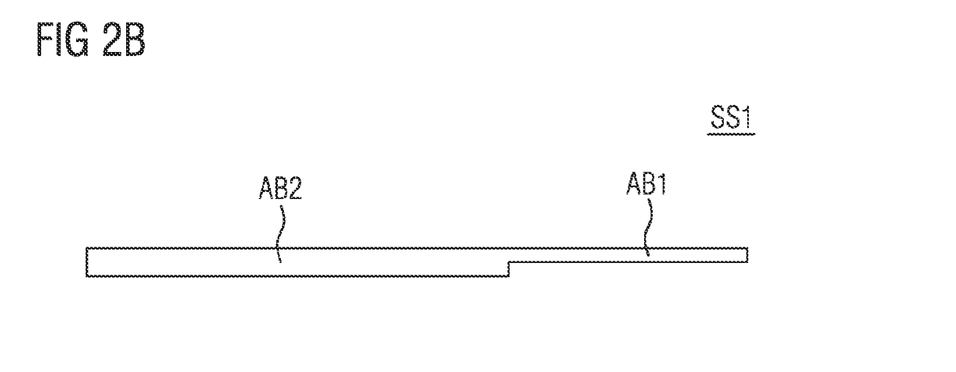

The tuning fork shape illustrated in FIG. 2a thus has an open end OE in the second region AB2 which provides a first bar region SB1 and a second bar region SB2. These bar regions surround an inner recess IA of the busbar SS1, which inner recess is open toward that end of the busbar SS1 that is opposite the first section AB1. The open end OE of the busbar SS1 is at that end of the busbar SS1 that faces away from the first section AB1 and thus from the contact area KF11. The open end OE is at the end at which the busbar SS5 and respectively its contact area KF5 is located in the printed circuit board. Seen in the longitudinal direction LA1 from the first section, the busbar SS1 ends before the busbar SS5 begins. In the longitudinal direction of the printed circuit board LP, there is thus a gap (filled with insulation material) between SS1 and SS5. This can in particular be gathered from FIG. 1B in conjunction with FIG. 2A, B.

Furthermore, it can be gathered from FIG. 2A that the busbar SS1 is symmetrical with respect to a central axis, wherein this central axis corresponds to the second longitudinal direction LA2 in the illustrated example. This longitudinal direction LA2 of the busbar SS1 preferably corresponds to the longitudinal direction LA1 of the printed circuit board LP. As a result, the busbar SS1 is provided centrally in the printed circuit board LP.

FIG. 2a shows contact areas KF12, KF13 present on both sides in relation to the longitudinal direction LA2 and constitute the connections for components which protrude into the recess of the busbar SS1 or into the recess AS1, AS2 of the printed circuit board LP. These components are part of a semiconductor carrier which can be arranged underneath the printed circuit board LP, as is illustrated further below. The contact area KF12 (and the optional contact area KF13) are provided in the bar regions SB1, SB2. In the section AB2 in which the recess, which is open to one side (cf. open end OE), is provided in the busbar SS1, the thickness of the busbar SS1 is greater than in the first section AB1 (see FIG. 2b) for better current-carrying capability.

Furthermore, it can be seen in FIG. 2a that the bar regions SB1, SB2, which arise due to the fact that the recess (IA) in the busbar SS1 is open on one side, provide a tapering, viewed in the longitudinal direction from the first section. This tapering starts from the first section AB1, that is to say in particular from where the second section AB2 begins, with the result that the bar regions initially have a greater width and taper over the course of the longitudinal direction LA2 toward the open end OE of the busbar SS1. As a result, a narrower component can be inserted between the contact areas KF13 than in the region between the bar regions SB1, SB2 which extend to the left thereof. The components and respectively the semiconductor carrier are preferably attached in such a way that relevant components of the semiconductor carrier are located between the contact areas KF12, KF13. This allows a particularly short connection by way of a surface connection technique, for example via bonding wires or bonding tapes.

Figure 3A:
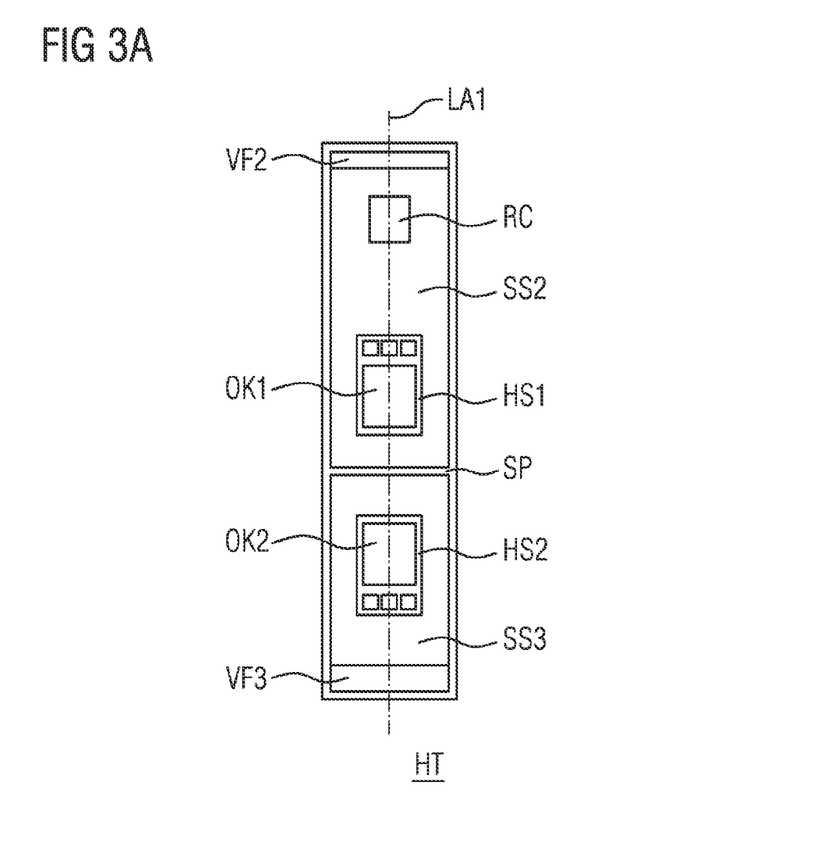
FIGS. 3a and 3b depict an example semiconductor carrier incorporating teachings of the present disclosure.
Figure 3B:
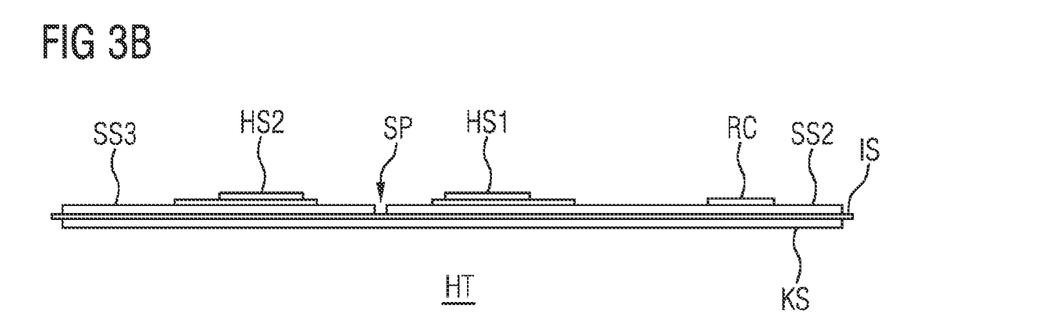

FIGS. 3a and 3b show an exemplary semiconductor carrier HT, wherein FIG. 3a illustrates a plan view and FIG. 3b illustrates a side view or a lateral plan view. The semiconductor carrier HT has a second busbar SS2 comprising an upper-side contact area KF2, and a third busbar SS3 comprising an upper-side contact area KF3. Located in the assembled module (cf. FIGS. 4A, B) are then five busbars, namely the first busbar SS1 of the printed circuit board LP, and a fourth and a fifth busbar SS4 and SS5 which form further busbars of the printed circuit board. The busbar SS2 and the busbar SS3 are the first and second busbar of the semiconductor carrier. In the assembled state, the first, fourth and fifth busbar SS1, SS4 and SS5 of the entire module are part of the printed circuit board LP, and the second and third busbar SS2, SS3 of the entire module are part of the semiconductor carrier HT. As illustrated, a semiconductor switch HS1, HS2 is fitted on each of these busbars SS2, SS3 of the semiconductor carrier HT. For example, the semiconductor switches HS1, HS2 can be soldered or sintered on the respective busbars SS2, SS3. A gap is located between the busbars SS2 and SS3 in the longitudinal direction LA1 of the semiconductor carrier HT so that these busbars are electrically insulated from one another. The two busbars SS2, SS3 are provided in the same plane of the carrier, i.e. provided on the same side, as can be seen in FIG. 3B. A snubber element RC, which is depicted as an integrated component, can likewise be located on one of the busbars of the semiconductor carrier HT, for example as illustrated on the busbar SS2 on which the semiconductor switch HS1 is also fitted.

The components RC, HS1 and HS2 fitted on the semiconductor carrier each have connection areas on their lower side which allow these components to be fitted on and electrically connected to the relevant busbar SS2, SS3. Components can also be provided with pins which have contact areas which are soldered or sintered onto the relevant busbar SS2, SS3. Furthermore, it can be seen that the two semiconductor switches HS1, HS2 have load-current contact surfaces OK1, OK2.

In FIGS. 3A, 3B, the two semiconductor switches HS1, HS2 are arranged one after the other in the longitudinal direction LA1 of the carrier HT. This also applies to the associated busbars SS2, SS3. In principle, a different arrangement would also be conceivable, for instance side-by-side, the busbars SS2, SS3 then having sections which lie side-by-side and which carry the semiconductor switches HS1, HS2. There would (also) be a gap in the longitudinal direction between the busbars SS2, SS3. In this case, as also in the illustrated case, the busbar SS2 would have a further section which provides the connection area VF2 at an end region (seen in the longitudinal direction), and the busbar SS3 would likewise have a further section which provides the connection area VF3 at an opposite end region.

Figure 4A:
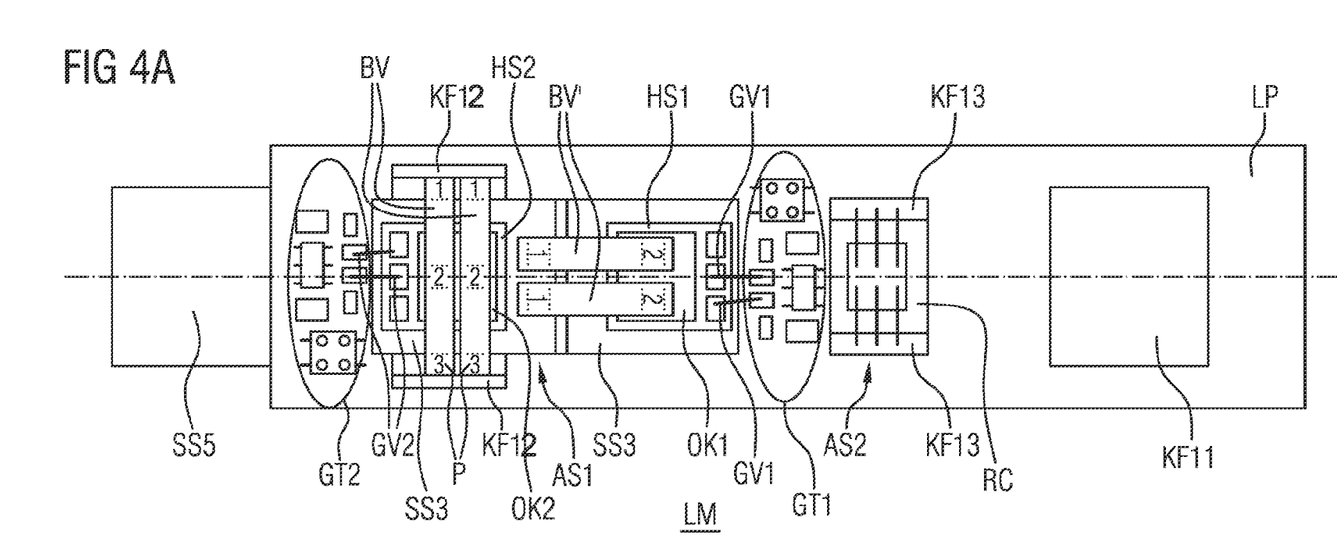
FIGS. 4a and 4b show construction possibilities of a power half-bridge module comprising a printed circuit board LP (among other things as a carrier of busbars) and a semiconductor carrier HT.
Figure 4B:
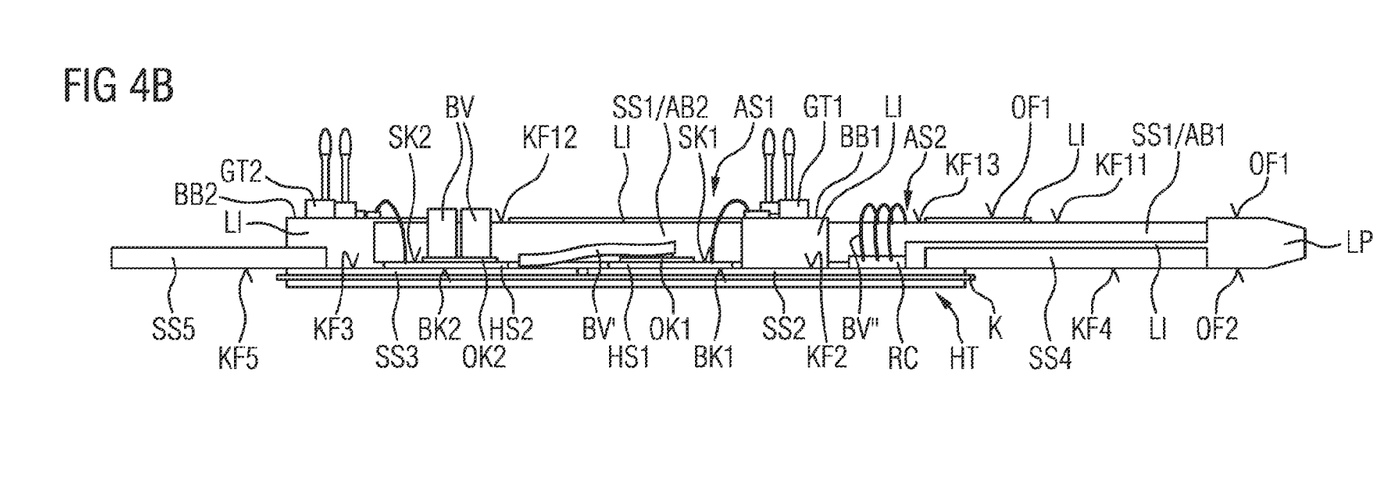

The contacting or interconnecting of the load-current contact surfaces OK1, OK2 is illustrated in more detail in FIGS. 4a and 4b. Control-signal contact surfaces are also located on the upper side of the semiconductor switches HS1, HS2, which are likewise electrically connected. The lower side of the semiconductor switches HS1, HS2 is thus connected to the busbars SS2, SS3 (by a soldered layer or a sintered layer), while the upper sides have load-current contact surfaces OK1, OK2 or control contact surfaces illustrated in more detail in FIG. 4a.

FIG. 3b shows a cross section of the semiconductor carrier HT comprising two busbars SS2, SS3. The semiconductor carrier thus comprises a first conductive layer which has two sections separated by a gap SP (perpendicular to the longitudinal direction LA1). The conductive layer forms the two busbars SS2, SS3. The first layer is provided on a first side (upper side) of the semiconductor carrier HT. This first conductive layer is also electrically separated from a second conductive layer by an insulation layer IS, which second conductive layer can for example be used for connecting to a heat sink. For this reason, this layer is referred to as cooling layer KS. The second conductive layer is provided on the second side (lower side) of the carrier HT in FIG. 3b. The insulation layer IS may be ceramic so that high strength with good heat throughput at the same time results. In FIG. 3B, the two layers are provided with the same thickness and are preferably made from the same material.

The carrier HT can be produced by pressing the two conductive layers (for instance copper) together with the intermediate insulation layer (for instance a ceramic such as aluminum oxide, Al nitride and the like). The semiconductor carrier can be in the form of a DCB carrier, wherein the conductive layers are made from the same material, or from different material, for instance Al as the material of the second layer and Cu as the material of the first layer. The thicknesses can also be different; the second conductive layer can thus be thicker than the first conductive layer. Designs without the second conductive layer are also possible, with the result that the carrier HT as carrier structure has only the first conductive layer and the insulation layer. The carrier HT can thus also be provided as a one-sided carrier structure.

A heat sink can adjoin the insulation layer (directly or via a heat-transferring layer). If the carrier structure of the carrier HT is two-sided, a heat sink can adjoin the second conductive layer KS (directly or via a heat-transferring layer). Further embodiments make provision for the layer KS to likewise have a busbar structure and/or to be used at least in sections as a component carrier or for external contacting. Finally, the carrier HT can be provided not as a conductor/ceramic assembly but comprise just two loose sheets which constitute the busbars SS2, SS3. If the latter are fastened on the lower side of the printed circuit board as illustrated, the lower side of the sheets, i.e. the lower side of the carrier HT, can be attached to a heat sink (in particular via an insulation layer). The heat sink is not necessarily part of the module.

FIGS. 4A and 4B show a power semiconductor module, wherein FIG. 4A is a plan view and FIG. 4B is a side view or a lateral plan view. In the plan view of FIG. 4B, it is possible to see the printed circuit board LP and respectively its first surface OF1 (cf. FIG. 1A) comprising the contact area KF11 of the first busbar SS1. The busbar extends to the left toward the second section AS2 and into the latter. There, the first busbar forms the contact areas KF12, KF11 which are located at the edge of recesses AS1, AS2 of the printed circuit board LP. Furthermore, illustrated on the surface LP are mounting regions BB1, BB2 which carry control and/or monitoring circuits GT1, GT2.

The fourth busbar SS4 can be seen in FIG. 4B and lies in the first section AB1 of the printed circuit board underneath the first busbar SS1. The busbar SS4 corresponds to the fourth busbar of the entire module LM and can be referred to as the second busbar of the printed circuit board LP. A third busbar of the printed circuit board LP and thus a fifth busbar SS5 of the entire module LM protrudes from the rest of the printed circuit board at that end of the second section that is opposite the first section AB1. As illustrated in FIG. 1A, the busbar SS5 forms a contact area KF5. The contact area KF5 of the busbar SS5 and the contact area KF11 of the first busbar SS2 are provided at opposite ends and in different sections of the module LM.

Thanks to the recesses AS1 and AS2 in the printed circuit board LP (and thus also in the first busbar), both the semiconductor switches HS1, HS2 and their contact surfaces OK1, OK2 as well as parts of the surfaces of the busbars SS2, SS3 of the semiconductor carrier HT can be seen in the plan view of FIG. 4A. FIG. 4B illustrates that the semiconductor carrier HT is attached to the lower side OF2 of the printed circuit board LP. As a result, the busbar SS5 of the printed circuit board LP is connected to the busbar SS3 of the semiconductor carrier HT, and the busbar SS4 of the printed circuit board LP is connected to the second busbar SS2. The connection is made through direct contact, wherein the connection may be established by a sintered connection or a soldered connection (wherein, on account of the resulting direct electrical connection, this electromechanical connection is also referred to as a direct connection).

In particular, the connection area VF5 (see FIG. 1B) of the busbar SS5 is connected directly to a surface section of the busbar SS3, namely to the connection area VF3 (cf. FIG. 3A). In a comparable way, the connection area VF4 of the busbar SS4 (cf. FIG. 1B) is connected directly to a corresponding section (connection area VF2) of the busbar SS2 of the semiconductor carrier HT by being placed thereon or via a sintered or soldered connection. The connection areas VF2, 3 are located on the surface or upper side of the carrier HT, in particular at the same height. The connection areas VF4, 5 of the busbars SS4, 5 of the printed circuit board LP are located on the lower side of the printed circuit board LP, i.e. on the lower surface, preferably at the same height. Generally, the heights of the connection areas of the printed circuit board and the associated connection areas of the carrier HT can be matched to each other in such a way that they both lie on top of each other when the printed circuit board is applied to the carrier.

The relevant connection areas VF2 and VF3 of the busbars SS2, SS3 of the semiconductor carrier HT are illustrated symbolically in FIG. 3A. This measure results in electrical connections between the busbars SS4, SS5 of the printed circuit board LP, on the one hand, and the busbars SS2, SS3 of the semiconductor carrier HAT, on the other hand. Since the semiconductor carrier HT (on the surfaces of its busbars) carries semiconductor switches HS1, HS2, contact thus also results between the busbars or the contact areas of the printed circuit board LP and the semiconductor carriers. By assembling the printed circuit board LP on the semiconductor carrier HT, the connections between the busbars SS4, SS5 of the printed circuit board LP and the busbars SS2, SS3 of the semiconductor carrier HT arise. A soldered layer or sintered layer between the areas VF3 and VF5 and a soldered layer or sintered layer between the areas VF2 and VF4 constitute the electrical connection (soldered connection, sintered connection) between the printed circuit board LT and the carrier HT.

A further connection between the printed circuit board and the semiconductor carrier LT (in particular its semiconductor switch HS2) results by way of the bond connection BV. This bond connection BV is illustrated as a plurality of bond tapes or sintering belts which each have a first end point (reference signs 1) and which are connected to contact areas KF12 of the printed circuit board LP or the first busbar SS1 of the printed circuit board LP (using a bonding technique). Second contact points (reference signs 2) of these bond connections BV are provided on the surface contact OK2 of the second semiconductor switch HS2. Thanks to the symmetrical implementation, the second end of the bond connection can also be connected to the contact areas KF12 via the end points or contact points 3. The contact point 3 of the respective bonding tape is located as point P on the upper side of the first busbar SS1 which forms the contact area KF12.

If an embodiment is provided with a first busbar SS1 that only has one bar region (as in FIG. 2a only the upper or lower bar region SB1 or SB2), the result is then only the contact points 1 or the contact points 3 (not 1 and 3 simultaneously), and the contact points 2, connecting the bond connection BV to the surface contact OK2 of the second semiconductor switch HS2.

A further bond connection is provided as bond connection BV' between the busbar SS3 (or a connection area thereof) and the surface contact OK1 of the semiconductor switch HS1. This connection BV' produces the series interconnection of the switches HS1, HS2, in particular the connection of the high-side switch HS1 to the phase connection (series circuit connecting point connection) of the busbar SS5.

The optional snubber element RC, likewise provided on the busbar SS2, is attached to the contact areas KF13 of the first busbar SS1 of the printed circuit board LP via bond connections BV". The connection is illustrated as a bonding wire connection here. By contrast, the bond connections BV, BV- are illustrated as a bonding strip connection or bonding tape connection. However, the connection BV" can also be provided as a bonding strip connection or bonding tape connection, like the connections BV, BV'. In principle, any type of surface-contacting connections can be provided as bonding connection. The connection of the contact areas OK1, OK2 of the semiconductor switches HS1, HS2 and possibly also the connection of a surface contact of the snubber element RC to the relevant contact areas KF11, KF12 and KF13 can generally be provided by a load-current connection. Thanks to the recess, it is possible to make these connections between components of the semiconductor carrier and contact areas of the busbars of the printed circuit board LP from the same side, namely from above.

There are also signal connections in the form of bond connections between control contact areas GV1, GV2 of control circuits, which connect on the printed circuit board LP, and corresponding contact surfaces on the semiconductor switches HS1, HS2. The connections are designated by these reference signs in FIG. 4a, wherein the contact areas on the part of the semiconductor switches are denoted by SK1, SK2 in FIG. 4b. The reference signs SK1, SK2 thus denote (upper-side) control-signal contact surfaces of power semiconductors HS1, HS2 which are in the form of semiconductor switches. Those surfaces of the semiconductor switches facing the busbars SS2, SS3 of the semiconductor carrier can also be referred to as load-current contact surfaces BK1, BK2 or as load-current connection surfaces which are used for the direct connection to the busbars SS2, SS3 (for instance via a soldered or sintered connection).

Furthermore, printed circuit board insulation material LI of the printed circuit board LP is illustrated, which insulation material is on the one hand provided partially on the surface OF1 and in particular between the busbars SS1, SS4.

In some embodiments, the semiconductor switches comprise MOSFETs or IGBTs. The construction may be SMD. The semiconductor switches HS1, HS2 are connected in series via the bond connection BV' (generally: via the load-current connection BV'). The busbar SS4 (and the connected busbar SS2) may be provided for a positive direct-voltage potential and the busbar SS1 for a negative direct-voltage potential. Their contact areas SS4 and SS1 are provided for connection to the two different poles of a direct-voltage supply. The busbar SS5 is provided for connecting to a phase, for instance. The busbar SS3 thus carries phase potential. The busbars SS3 and SS5 or the relevant phase contact KF5 is connected to the connection point of the two semiconductor switches HS1 which are connected in series.

In some embodiments, the semiconductor switch HS1 is the high-side switch, and the semiconductor switch HS2 is the low-side switch. The drain connection of the semiconductor switch HS1 is formed by its lower side or by the bottom-side load-current contact surface BK1 of the semiconductor switch HS1. The source connection is in particular formed by the surface contact OK1. The latter is connected via the connection BV' to the busbar SS3 which is in turn connected to the bottom-side load-current contact surface BK2 of the second semiconductor switch HS2. This surface forms the drain connection of the semiconductor switch HS2. The source connection of the semiconductor switch HS2 is formed by the surface contact OK2 of this switch HS2. This source contact of the semiconductor switch HS2 is connected to the first busbar SS1 by the connection BV. The contact area KF4 thus forms the positive connection of the module and the contact areas KF11 and respectively KF12 form the negative connection of the module, while the contact area KF5 is the phase connection or center connection of the semiconductor bridge.

In some embodiments, the control-signal contact surface SK1 is the gate connection of the semiconductor switch HS1, and the control-signal contact surface SK2 is the gate connection of the semiconductor switch HS2. These surfaces lead to respective control circuits or gate driver circuits GT1, GT2. In order to use these control circuits GT1, GT2, pins GA1, GA2 are provided as illustrated (cf. FIG. 1B), which pins protrude away from the surface OF1 and are used to make contact with a superordinate controller. The designations source and drain relate to MOSFETs as semiconductor switches HS1, 2. If the latter are in the form of IGBTs, then drain can be replaced by collector and source can be replaced by emitter. Generally, "gate" can also be regarded as a control connection of the semiconductor switches.

While the printed circuit board is formed of conductor layers (copper layers) and prepreg as insulation material LI, the illustrated embodiment shows a semiconductor carrier HT comprising two conductive layers (e.g. likewise copper) which are connected to one another by a ceramic layer K. The semiconductor carrier is produced by pressing these conductive layers together with the insulation layer or ceramic layer K.

A production method for the power semiconductor module can be as follows: Before the printed circuit board LP, making the recesses AS1 (and optionally AS2). The contact areas KF11, KF4 and KF5 are either exposed or emerge as exposed areas during the production of the semiconductor. In order to produce the printed circuit board LP, the first busbar SS1 can firstly be produced by providing a conductive sheet. In some embodiments, the step (difference in thickness between the first and second section) illustrated in FIG. 1b is provided.

In order to produce the semiconductor carrier HT, use is made of a printed circuit board (ceramic/metal composite) which is coated on both sides and is provided with a gap SP in order to thus electrically separate the two busbars SS2, SS3 from one another. Instead of producing the carrier in this way, it is also possible to just depict the busbars SS2, SS3 as individual sheets on which the printed circuit board is fastened.

The module arises during the production by fastening the printed circuit board LP on the semiconductor carrier HT. During the fastening, the two lower-side busbars SS4 and SS5 of the printed circuit board are connected to the semiconductor carrier HT or to its busbars SS2, SS3 by sintering or soldering. Preferably, the busbars SS3, SS4 of the semiconductor carrier are fitted with the two semiconductors HS1, HS2 before this connection step. However, this can also happen after the carrier HT has been arranged on the printed circuit board LP. The contact areas KF12 and respectively KF13 of the first busbar of the printed circuit board LP are connected to the surface contact of the second semiconductor switch HS2 by bonding (or by another surface-based connection type).

The first semiconductor switch is likewise connected to the second semiconductor switch in a surface-contact-based manner, namely by virtue of its surface contact OK1 being connected by a bond connection BV' or by another surface-based contact connection to the busbar on which the second semiconductor switch HS2 is located. The control circuits GT1, GT2 can be created in particular by equipping the connection region BB1, BB2. Furthermore, control connections between these control circuits and control surface contacts of the semiconductor switches are produced (cf. GV1, GV2).

One aspect of the production is the formation of numerous printed circuit boards side-by-side. After assembly and in some cases after mounting and producing the bond connections, these printed circuit boards are separated, for instance by cutting, punching or perforating and subsequently ripping the perforation. The separation may take place after connecting the printed circuit boards to corresponding semiconductor carriers. In this embodiment, the printed circuit boards are thus not initially produced individually but rather as a plurality side-by-side on one and the same substrate.

In some embodiments, the semiconductor carriers are also produced as a plurality side-by-side on one and the same substrate (a substrate other than that of the printed circuit boards), in particular also a ceramic-metal composite substrate. The modules produced in this way are separated before or after connecting the printed circuit boards to the semiconductor carriers. One embodiment makes provision for a plurality of printed circuit boards to be produced side-by-side on a substrate, for a multiplicity of semiconductor carriers to be produced individually or produced on a common substrate and subsequently separated, and for the individual semiconductor carriers to be fitted to the printed circuit boards before the separating.

In some embodiments, a snubber element can be fitted on the semiconductor carrier. During the connection of the semiconductor carrier to the printed circuit board, this snubber element protrudes into the second recess AS2 and, after the carrier HT has been connected to the printed circuit board LP, is attached to the contact area KF13 of the first busbar of the printed circuit board LP by a surface-based connection technique. A bond connection BV'" produced for this purpose is illustrated in the figures.

Provision can be made for a power electronic apparatus which comprises a plurality of the illustrated power half-bridge modules. This apparatus can have a heat sink (e.g. with fluid flowing through it) which has two (opposite) sides that each carry one of the two modules. Here, that surface of the carrier HT that protrudes away from the printed circuit board is connected to the heat sink in a heat-transferring manner. The modules can be electrically connected to one another over the width of the heat sink, for instance by plug-in attachments or other electrical connections which connect the same contact areas of the different modules to one another.

One embodiment of the power module described here can be described, with optional reference to the reference signs, as follows: a power half-bridge module LM has a printed circuit board LP comprising a first longitudinal section AB1 in which two busbars SS1, SS4 are arranged such that they partly lie one over the other. The latter form contact areas KF11, KF4 for external connection. A first of the busbars SS1 extends further into a second longitudinal section AB2. In this second longitudinal section, the printed circuit board LP has at least one recess AS1. In the second longitudinal section AB2, the first busbar SS1 has contact areas KF12, KF13 in an edge region which surrounds the recess AS1 at least on one side of the recess. In the further course of the second longitudinal section AB2, an additional busbar SS5 is provided, which additional busbar extends to the end opposite the end to which the two busbars SS1, SS4 extend.

A semiconductor carrier HT has two busbars SS2, SS3 lying next to each other on one side. A semiconductor switch is fitted on each of these two busbars, for instance by soldering or sintering. The semiconductor switches protrude into the recess AS1 in the printed circuit board LP such that a surface connection connects an upper-side connection area of one of the semiconductor switches HS2 to the contact area KF12, for instance a bonding connection. The other semiconductor switch HS1 has an upper-side connection area too. This upper-side connection area is connected to the busbar by way of a further surface connection, the first-mentioned semiconductor switch HS2 being arranged on said busbar.

What is claimed is:

1. A power half-bridge module comprising:
   a busbar carrier including an electrically insulating insulation material embedding a first busbar with a first longitudinal section and a second longitudinal section adjoining the first longitudinal section in the longitudinal direction of the busbar carrier;
   wherein the first busbar has a first exposed contact area on the first longitudinal section and a second exposed contact area on the second longitudinal section and to the side of a first surface of the busbar carrier;
   wherein the busbar carrier has a first recess located at the height of the second longitudinal section) and extending from the first surface to a second surface of the busbar carrier facing away from the first surface;
   a semiconductor carrier with a second busbar and a third busbar in a row in the longitudinal direction of the busbar carrier;
   a first semiconductor switch with a lower-side load-current contact area arranged on a contact area of the second busbar; and
   a second semiconductor switch with a lower-side load-current contact area arranged on a contact area of the third busbar;
   wherein the semiconductor carrier is arranged on the second surface of the busbar carrier so the first and second semiconductor switches protrude into the first recess;
   wherein the second semiconductor switch has an upper-side load-current contact area electrically connected to the second contact area of the first busbar.

2. The power half-bridge module as claimed in claim 1, wherein the second longitudinal section partially or fully surrounds the first recess.

3. The power half-bridge module as claimed in claim 1, wherein the second longitudinal section has two limb regions spread apart on either side of the first recess and extending in the longitudinal direction.

4. The power half-bridge module as claimed in claim 3, wherein the two limb regions of the second longitudinal section are on either side of the first recess symmetrically to one another about the longitudinal axis of the first busbar.

5. The power half-bridge module as claimed in claim 3, wherein the second contact area of the first busbar is arranged spread apart on the two limb regions.

6. The power half-bridge module as claimed in claim 5, wherein the second contact area of the first busbar on the two limb regions are symmetric in relation to one another about the first recess.

7. The power half-bridge module as claimed in claim 1, wherein the second longitudinal section has a greater layer thickness than the first longitudinal section.

8. The power half-bridge module as claimed in claim 1, wherein:
the busbar carrier has a first mounting region on the first surface, and a first control circuit for actuating the first semiconductor switch or part of the first control circuit mounted on the first mounting region;
wherein the first semiconductor switch has a upper-side control-signal contact area electrically connected to the first control circuit or to the part of the first control circuit, respectively.

9. The power half-bridge module as claimed in claim 8, wherein the first mounting region is electrically insulated from the first busbar by the insulation material of the busbar carrier.

10. The power half-bridge module as claimed in claim 9, wherein, the first mounting region comprises a printed circuit board.

11. The power half-bridge module as claimed in claim 9, wherein the first mounting region is cast, overmolded, or encapsulated by the insulation material.

12. The power half-bridge module as claimed in claim 1, wherein:
the busbar carrier has a second mounting region on the first surface, and a second control circuit or part of the second control circuit for actuating the second semiconductor switch mounted on the second mounting region;
wherein the second semiconductor switch has an upper-side control-signal contact area electrically connected to the second control circuit or to the part of the second control circuit, respectively.

13. The power half-bridge module as claimed in claim 1, wherein the busbar carrier comprises a printed circuit board.

14. The power half-bridge module as claimed in claim 1, wherein:
the busbar carrier has a second recess located at the height of the second longitudinal section and extending from the first surface to the second surface of the busbar carrier; and
the semiconductor carrier has an RC snubber arranged on the contact area of the second busbar, the RC snubber physically and electrically connected to the second busbar and protruding into the second recess.

15. The power half-bridge module as claimed in claim 14, wherein the second recess is located between the first longitudinal section and the first recess.

16. The power half-bridge module as claimed in claim 14, wherein: the first busbar has a third exposed contact area on the second longitudinal section and to the side of the first surface of the busbar carrier; wherein the resistor-capacitor (RC) snubber is electrically connected to the third contact area.

17. The power half-bridge module as claimed in claim 1, further comprising
a fourth busbar embedded in the insulation material of the busbar carrier with an exposed contact area to the side of the second surface of the busbar carrier;
wherein the fourth busbar and the first longitudinal section overlap one another and are electrically insulated from one another by the insulation material of the busbar carrier;
wherein the second busbar by way of the exposed contact area is arranged on the contact area of the fourth busbar and is physically and electrically connected to the fourth busbar.

18. The power half-bridge module as claimed in claim 17, wherein the fourth busbar lies at least in part directly on the second busbar and is physically connected to and electrically and thermally contacted with the second busbar.

19. The power half-bridge module as claimed in claim 18, wherein the fourth busbar is soldered or sintered or adhesively bonded or welded directly on the second busbar.

20. The power half-bridge module as claimed in claim 1, further comprising
a fifth busbar embedded in the insulation material of the busbar carrier and having an exposed contact area to the side of the second surface of the busbar carrier;
wherein the third busbar by way of the exposed contact area is arranged on the contact area of the fifth busbar and is physically and electrically connected to the fifth busbar.

21. The power half-bridge module as claimed in claim 20, wherein the fifth busbar lies at least in part directly on the third busbar and is physically connected to and electrically and thermally contacted with the third busbar.

22. The power half-bridge module as claimed in claim 21, wherein the fifth busbar is soldered or sintered or adhesively bonded or welded directly on the third busbar.

23. The power half-bridge module as claimed in claim 1, wherein:
the semiconductor carrier has an insulation layer;
the second busbar by way of the side facing away from the first semiconductor switch is arranged on the insulation layer and is physically and thermally connected to the insulation layer; and
the third busbar by way of the side facing away from the second semiconductor switch is arranged on the insulation layer and is physically and thermally connected to the insulation layer.

24. The power half-bridge module as claimed in claim 23, wherein the insulation layer comprises a ceramic insulator.

25. The power half-bridge module as claimed in claim 23, wherein the semiconductor carrier comprises a cooler arranged on one side of the insulation layer facing away from the second busbar and the third busbar and is physically and thermally connected to the insulation layer.

26. The power half-bridge module as claimed in claim 1, wherein the semiconductor carrier comprises a Direct Copper Bonding (DCB) carrier or an Active Metal Brazing (AMB) carrier.

27. The power half-bridge module as claimed in claim 1, wherein the first semiconductor switch by way of an upper-side load-current contact area is electrically connected to the contact area of the third busbar.

28. The power half-bridge module as claimed in claim 1, wherein the first busbar is axially symmetric.

29. A power inverter comprising:
at least three power half-bridge modules, wherein each power half-bridge module comprises:
a busbar carrier including an electrically insulating insulation material embedding first busbar with a first longitudinal section and a second longitudinal section adjoining the first longitudinal section in the longitudinal direction of the busbar carrier;

wherein the first busbar has a first exposed contact area on the first longitudinal section and a second exposed contact area on the second longitudinal section and to the side of a first surface of the busbar carrier;

wherein the busbar carrier has a first recess located at the height of the second longitudinal section and extending from the first surface to a second surface of the busbar carrier facing away from the first surface;

a semiconductor carrier with a second busbar and a third busbar in a row in the longitudinal direction of the busbar carrier;

a first semiconductor switch with a lower-side load-current contact area arranged on a contact area of the second busbar; and second semiconductor switch with a lower-side load-current contact area arranged on a contact area of the third busbar;

wherein the semiconductor carrier is arranged on the second surface the busbar carrier the first and second semiconductor switches protrude into the first recess;

wherein the second semiconductor switch has an upper-side load-current contact area electrically connected to the second contact area of the first busbar;

wherein the power half-bridge modules form a three-phase bridge circuit of the power inverter.

30. A method for producing a power half-bridge module, the method comprising: providing a busbar carrier including an electrically insulating insulation material, with a first busbar comprising a first longitudinal section and a second longitudinal section which adjoins the first longitudinal section in the longitudinal direction of the busbar carrier, wherein both the first busbar and the second busbar are embedded in the insulation material; forming a first exposed contact area on the first longitudinal section and a second exposed contact area on the second longitudinal section, wherein the second contact area is formed to the side of a first surface of the busbar carrier; forming a first recess in the busbar carrier, wherein the first recess is formed at the height of the second longitudinal section extending from the first surface to a second surface of the busbar carrier, which second surface faces away from the first surface; providing a semiconductor carrier comprising a second busbar and a third busbar; arranging a first semiconductor switch by way of its lower-side load-current contact area on a contact area of the second busbar and physically and electrically connecting the first semiconductor switch to the second busbar; arranging a second semiconductor switch by way of its lower-side load-current contact area on a contact area of the third busbar and physically and electrically connecting the second semiconductor switch to the third busbar; after arranging the first and the second semiconductor switch, arranging the semiconductor carrier on the second surface the busbar carrier in such a way that the first and second semiconductor switches protrude into the first recess; and electrically connecting the second semiconductor switch by way of its upper-side load-current contact area to the second contact area of the first busbar.

* * * * *